United States Patent [19]
Hadley et al.

[11] Patent Number: 5,903,590
[45] Date of Patent: May 11, 1999

[54] VERTICAL-CAVITY SURFACE-EMITTING LASER DEVICE

[75] Inventors: G. Ronald Hadley; Kevin L. Lear; Adelbert Awyoung; Kent D. Choquette, all of Albuquerque, N.M.

[73] Assignee: Sandia Corporation, Albuquerque, N.M.

[21] Appl. No.: 08/650,242

[22] Filed: May 20, 1996

[51] Int. Cl.$^6$ ............................................. H01S 3/19
[52] U.S. Cl. ........................... 372/96; 372/46; 372/45
[58] Field of Search ........................... 372/96, 45, 46, 372/98; 257/76

[56] References Cited

U.S. PATENT DOCUMENTS

| | | | |
|---|---|---|---|
| 5,020,066 | 5/1991 | Iga | 372/45 |
| 5,038,356 | 8/1991 | Botez | 372/45 |
| 5,086,430 | 2/1992 | Kapon et al. | 372/46 |
| 5,164,949 | 11/1992 | Ackley et al. | 372/96 |
| 5,256,596 | 10/1993 | Ackley et al. | 372/45 |
| 5,258,316 | 11/1993 | Ackley et al. | 372/45 |
| 5,295,147 | 3/1994 | Jewell et al. | 372/98 |
| 5,314,838 | 5/1994 | Cho et al. | 372/45 |
| 5,337,327 | 8/1994 | Ackley | 372/45 |
| 5,348,912 | 9/1994 | Choquette | 437/129 |
| 5,351,257 | 9/1994 | Lebby et al. | 372/96 |
| 5,353,295 | 10/1994 | Holonyak | 372/50 |
| 5,357,591 | 10/1994 | Jiang | 385/37 |
| 5,388,120 | 2/1995 | Ackley et al. | 372/45 |
| 5,425,043 | 6/1995 | Holonyak | 372/50 |
| 5,444,731 | 8/1995 | Pfister | 372/99 |
| 5,446,752 | 8/1995 | Ackley | 372/46 |
| 5,446,754 | 8/1995 | Jewell | 372/50 |
| 5,468,656 | 11/1995 | Shieh | 437/23 |
| 5,493,577 | 2/1996 | Choquette | 372/46 |
| 5,726,462 | 3/1998 | Spahn et al. | 257/76 |

OTHER PUBLICATIONS

G. R. Hadley, "Modes of a Two–Dimensional Phase–Locked Array of Vertical–Cavity Surface–Emitting Lasers," *Optics Letters*, vol. 15, pp. 1215–1217, Nov. 1, 1990.

C. J. Chang–Hasnain, Y. A. Wu, G. S. Li, G. Hasnain, K. D. Choquette, C. Caneau, and L. T. Florez, "Low Threshold Buried Heterostructure Vertical Cavity Surface Emitting Laser," *Applied Physics Letters*, vol. 63, pp. 1307–1309, Sep. 6, 1993.

G. R. Hadley, "Effective Index Model for Vertical–Cavity Surface–Emitting Lasers," *Optics Letters*, vol. 20, pp. 1483–1485, Jul. 1, 1995.

G. R. Hadley, K. L. Lear, M. E. Warren, K. D. Choquette, J. W. Scott, and S. W. Corzine, "Comprehensive Numerical Modeling of Vertical–Cavity Surface–Emitting Lasers," *IEEE Journal of Quantum Electronics*, vol. 32, pp. 607–616, Apr. 1996.

G. R. Hadley, K. D. Choquette, and K. L. Lear, "Understanding Waveguiding in Vertical–Cavity Surface–Emitting Lasers," *Integrated Photonics Research Technical Digest*, vol. 6 [Optical Society of America, Washington, D.C.] Apr. 29, 1996.

*Primary Examiner*—Rodney Bovernick
*Assistant Examiner*—Yisun Song
*Attorney, Agent, or Firm*—John P. Hohimer

[57] ABSTRACT

A vertical-cavity surface-emitting laser device. The vertical-cavity surface-emitting laser (VCSEL) device comprises one or more VCSELs with each VCSEL having a mode-control region thereabout, with the mode-control region forming an optical cavity with an effective cavity length different from the effective cavity length within each VCSEL. Embodiments of the present invention can be formed as single VCSELs and as one- or two-dimensional arrays of VCSELs, with either an index-guided mode of operation or an index anti-guided mode of operation being defined by a sign of the difference in the two effective cavity lengths.

42 Claims, 10 Drawing Sheets

VERTICAL-CAVITY SURFACE-EMITTING LASER DEVICE

This invention was made with Government support under Contract No. DE-AC04-94AL85000 awarded by the U.S. Department of Energy. The Government has certain rights in the invention.

FIELD OF THE INVENTION

The present invention relates generally to semiconductor lasers and, more particularly, to semiconductor lasers of the vertical-cavity surface-emitting type.

BACKGROUND OF THE INVENTION

Vertical-cavity surface-emitting lasers (VCSELs) are useful for many applications including free-space and optical fiber telecommunications, optical interconnects, optical computing, optical recording and readout systems, and laser printers and scanners. For many of these applications, lasing action with a high beam quality and a high output power is required.

In the case of a single VCSEL device, a high beam quality requires a stable lateral mode of operation which is difficult to attain, especially as the lasing output power is increased or an operating temperature of the device is changed. In the case of an array of VCSELs, a coupling of the lasing action between individual VCSELs in the array primarily determines the beam quality and useful lasing output power (e.g. the amount of total output power that can be focused into a diffraction-limited spot or an optical fiber, or propagated over a distance). Attempts in the prior art to improve the beam quality and output power of VCSEL arrays have met with limited success. These prior-art attempts are largely based on evanescent coupling between adjacent VCSELs, and have further included laterally varying the reflectivity of a stack mirror forming the VCSEL array, or providing an optical element external to the VCSEL array for phase control (see, for example, U.S. Pat. Nos. 5,353,295 and 5,425,043 to Holonyak et al; U.S. Pat. No. 5,444,731 to Pfister; and U.S. Pat. No. 5,446,754 to Jewell et al).

An advantage of the vertical-cavity surface-emitting device of the present invention is that one or more vertical-cavity surface-emitting lasers (VCSELs) can be formed with a mode-control region having predetermined characteristics for defining and controlling a lateral mode for lasing within each VCSEL.

Another advantage of the present invention is that at least one pair of adjacent VCSELs can be formed with the mode-control region surrounding each VCSEL further acting to couple the lasing action between the pair of VCSELs, thereby providing a phase-locked operation characterized by the pair of VCSELs emitting laser beams which are substantially in phase with each other and therefore additive to form a single-lobed far-field output beam.

A further advantage of the present invention is that either index guided or index anti-guided operation of one or more VCSELs can be provided by adjusting one or more characteristics of the mode-control region either during epitaxial growth or thereafter.

Yet another advantage of the present invention is that the mode-control region which defines and controls a lasing mode within the VCSEL device can further act to channel an electrical current into a semiconductor light-emitting region of the device, thereby providing for efficient lasing action within the VCSEL device.

These and other advantages of the vertical-cavity surface-emitting laser device of the present invention will become evident to those skilled in the art upon examination of the following description, or can be learned by practice of the present invention.

SUMMARY OF THE INVENTION

The present invention relates to a vertical-cavity surface-emitting laser device comprising at least one vertical-cavity surface emitting-laser (VCSEL) having a first effective cavity length and a mode-control region formed laterally about the VCSEL, with the mode-control region having a second effective cavity length different from the first effective cavity length. Each VCSEL further comprises a layered semiconductor light-emitting region of predetermined lateral dimensions and including a semiconductor junction; a first pair of mirrors sandwiched about the light-emitting region and forming the first optical cavity; and electrodes above and below the semiconductor junction for activating the light-emitting region to produce lasing action. The mode-control region further comprises a mode-coupling portion having a second pair of mirrors sandwiched thereabout for forming a second optical cavity. One or more characteristics (e.g. a dielectric material or semiconductor alloy composition, a refractive index, a layer thickness, or a layer position) of the mode-coupling portion can be predetermined to adjust the second effective cavity length to be larger or smaller than the first effective cavity length either during epitaxial growth or thereafter. Additionally, a reflectivity of one or both of the second pair of mirrors can be adjusted to further define and control the lateral mode or lateral mode coupling within the VCSEL device. Embodiments of the present invention can be in the form of single VCSEL devices, or in the form of one- or two-dimensional arrays of VCSELs.

Various advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

The present invention is described herein with reference to a series of examples of vertical-cavity surface-emitting laser (VCSEL) devices comprising one or more VCSELs having a first effective cavity length and mode-control regions formed thereabout with a second effective cavity length that is different from the first effective cavity length.

EXAMPLE 1

Figure 1:
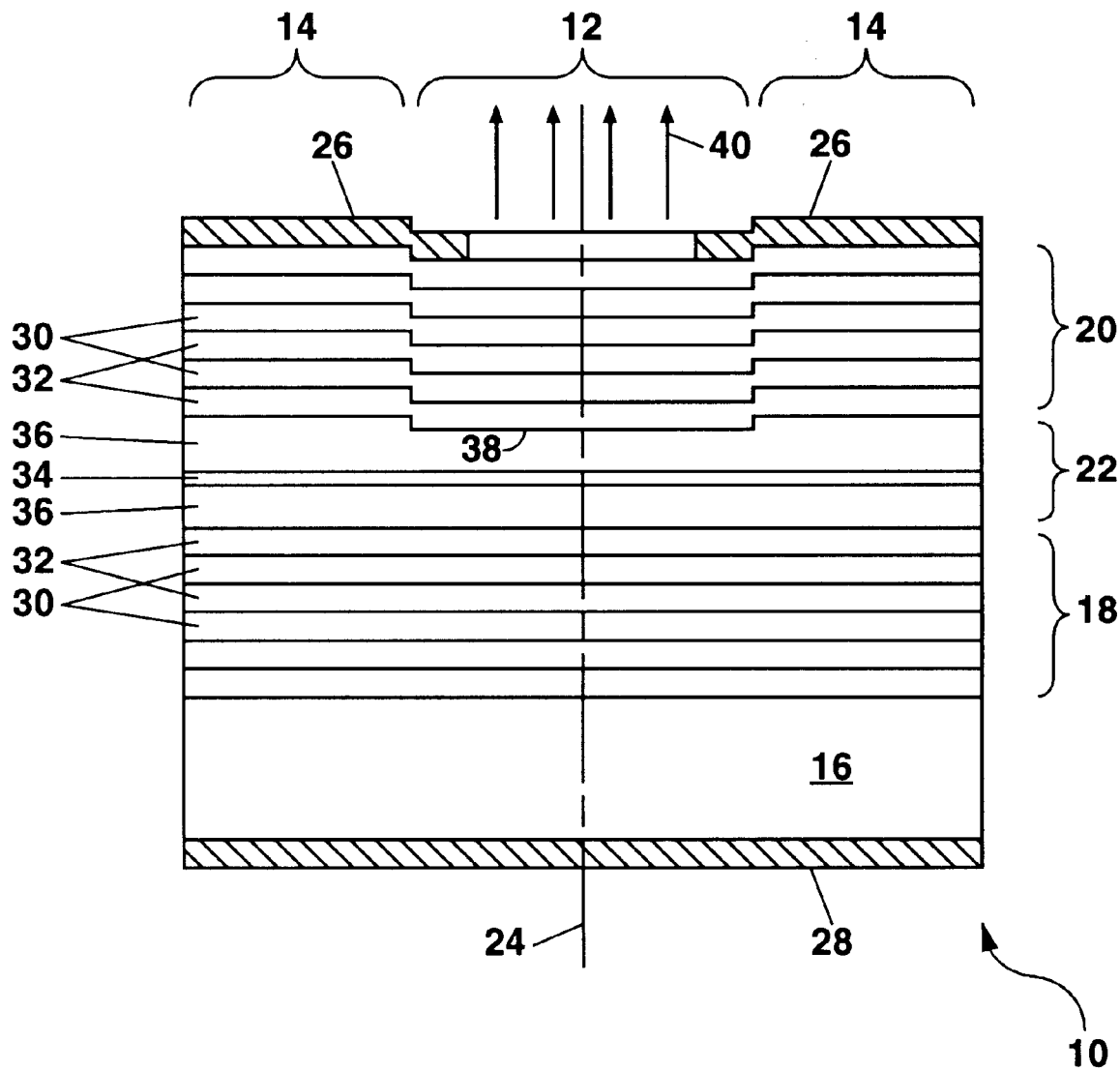
FIG. 1 shows a schematic cross-section diagram of a first example of a VCSEL device formed according to the present invention by a selective etching process followed by epitaxial regrowth of a plurality of semiconductor layers.

Referring to FIG. 1, there is shown a schematic cross-section diagram of a first example of a VCSEL device according to the present invention. The VCSEL device 10 comprises at least one vertical-cavity surface-emitting laser 12 and a mode-control region 14 extending laterally outward therefrom. According to the present invention, the VCSEL 12 and the mode-control region 14 have different effective cavity lengths. An effective cavity length, $L_{eff}$, is defined herein to be an optical length of a resonant optical cavity having a plurality of layers therein as determined from a sum over an actual layer thickness, L, of each layer within the optical cavity times a refractive index, n, of the material forming that layer. For a VCSEL device 10, the effective cavity length, $L_{eff}$, can extend at least partway into one or more stack mirrors (i.e. distributed Bragg reflector mirrors) of the resonant optical cavity.

The VCSEL device 10 according to the first example of the present invention is formed by epitaxially growing a plurality of III–V or II–VI semiconductor layers on a substrate 16, with the semiconductor layers forming a pair of stack mirrors (e.g. a lower stack mirror 18 and an upper stack mirror 20) sandwiched about a layered active region 22 having a semiconductor p-n or p-i-n junction therein. A central portion of the active region 22 disposed about an optical axis 24 with lateral dimensions substantially equal to the lateral dimensions of the VCSEL 12 forms a light-emitting region while an outer annular portion of the active region 22 forms a mode-coupling portion having lateral dimensions substantially equal to the lateral dimensions of the mode-control region 14. Electrodes (e.g. an upper electrode 26 and a lower electrode 28) are provided above and below the semiconductor junction for activating the light-emitting region to produce lasing action therein.

To form the VCSEL device 10 according to the first example of the present invention in FIG. 1, a plurality of semiconductor layers are epitaxially grown on a compound semiconductor substrate 16 by an epitaxial growth process such as molecular beam epitaxy (MBE), metal-organic chemical vapor deposition (MOCVD) or the like. The substrate 16 can be any compound semiconductor substrate (e.g. GaAs, GaP, InP, InGaAs, etc.) that is substantially lattice-matched with semiconductor alloys forming the lower stack mirror 18 (e.g. a GaAs substrate 16 for epitaxial growth of a GaAs/AlGaAs lower stack mirror 18). The substrate 16 as defined herein can further include one or more buffer layers (generally with a dopant type that is the same as that of the substrate) epitaxially grown thereon for smoothing or conditioning an upper surface of the substrate, or for altering a lattice constant prior to epitaxial growth to provide better lattice matching with the lower stack mirror 18. The substrate 16 can be doped, for example, n-type with Si to about $10^{18}$ cm$^{-3}$.

The lower stack mirror 18 is grown as a unipolar structure with a dopant type that is the same polarity as that of the substrate 16 (e.g. n-type doped with Si to about $5 \times 10^{17}$ cm$^{-3}$ or more). The lower stack mirror 18 comprises a plurality of mirror periods each formed from a high-refractive-index semiconductor layer 30 and an alternating low-refractive-index semiconductor layer 32 as shown in FIG. 1, with each of the semiconductor layers 30 and 32 being about one-quarter wavelength thick. The number of mirror periods can be predetermined to provide a particular reflectivity value which is generally in the range of about 95–99.5% at a predetermined wavelength range for lasing for the VCSEL device 10. To provide for lasing action in the wavelength range of about 600–1000 nanometers (nm), for example, the low-refractive-index semiconductor layers 32 can be either AlAs or AlGaAs, and the high-refractive-index semiconductor layers 30 can be either GaAs or AlGaAs with a lower aluminum composition than the low-refractive-index semiconductor layers 32. Other semiconductor alloy compositions can be used for other wavelength ranges. An effective optical thickness (defined herein as an as-formed or actual layer thickness, L, of a particular semiconductor or dielectric layer multiplied by a refractive index, n, of the material forming that layer) of each layer forming the lower stack mirror 18 is preferably about one-quarter of the wavelength of the lasing action provided by the VCSEL device 10.

According to the first example of the present invention in FIG. 1, a layered active region 22 is provided above the lower stack mirror 18. The active region 22 is epitaxially grown and can comprise one or more quantum-well layers 34 sandwiched between a pair of cladding layers 36, with multiple quantum-well layers 34 being separated by barrier layers (not shown) having a higher bandgap energy than the bandgap energy of the quantum-well layers 34. As used herein, a quantum-well layer 34 is a semiconductor layer providing a quantum confinement of electrons and holes therein by means of one or more quantum wells, quantum wires, or quantum dots. The various layers in the active region 22 are formed from predetermined III–V or II–VI compound semiconductor alloys to provide a specified wavelength range of use of the VCSEL device 10. As an example, for operation over a wavelength range centered near 980 nanometers, the quantum-well layer(s) 34 can comprise strained InGaAs, with the cladding layers 36 being GaAs.

The cladding layers 36 further have a bandgap energy larger than the bandgap energy of the quantum-well layer(s) 34. If a plurality of quantum-well layers 34 are used, the barrier layers separating the individual quantum-well layers 34 generally have a bandgap energy intermediate between the bandgap energies of the quantum-well layers 34 and the cladding layers 36. Furthermore, the cladding layers 36 can have a semiconductor alloy composition that is uniform in the growth direction, forming a separate confinement heterostructure active region 22; or alternately, the semiconductor alloy composition of the cladding layers 36 can be graded in the growth direction (i.e. graded from a higher-bandgap to a lower-bandgap alloy composition for the first-grown cladding layer 36, and graded from a lower-bandgap to a higher-bandgap alloy composition for the last-grown cladding layer 36), forming a graded-index separate confinement heterostructure (GRIN-SCH) active region 22.

The first-grown cladding layer 36 in FIG. 1 can be doped about the same as the adjacent lower stack mirror 18 (e.g. n-type doped to about $5 \times 10^{17}$ cm$^{-3}$ with Si); whereas the last-grown cladding layer 36 is oppositely doped (e.g. p-type doped to about $5 \times 10^{17}$ cm$^{-3}$ with C) to form a semiconductor p-n or p-i-n junction across the active region 22. The quantum-well layer(s) 34 are generally undoped (i.e. unintentionally doped or intrinsic).

After epitaxial growth of the active region 22, the last-grown cladding layer 36 is patterned by a selective etching process to provide a difference in the effective cavity lengths, $L_{eff}$, of the vertical-cavity surface-emitting laser 12 and the mode-control region 14. This can be performed, for example, by photolithographically masking an exposed upper surface of the last-grown cladding layer 36 and etching a well 38 downward into the last-grown cladding layer 36 coinciding with the location of the light-emitting region of the VCSEL 12. The etched well 38 reduces the effective cavity length (i.e. a first effective cavity length, $L_{eff-1}$) of the light-emitting region within the VCSEL 12 relative to the effective cavity length (i.e. a second effective cavity length, $L_{eff-2}$) of the mode-control region 14.

In other embodiments of the present invention, an annular trench can be formed in the last-grown cladding layer 36 in the mode-control region 14 to reduce the second effective cavity length, $L_{eff-2}$, relative to the first effective cavity length, $L_{eff-1}$, of the VCSEL 12, which is masked for protection during the etching step. The location of the well 38 or annular trench will depend on a particular type of VCSEL device 10 to be formed (e.g. an index-guided VCSEL device 10 or an index-antiguided VCSEL device 10).

In the example of FIG. 1, to provide a uniformity of the first effective cavity length, $L_{eff-1}$, across the well 38 and/or to precisely define a particular value of the first effective cavity length, $L_{eff-1}$, (e.g. about one-half wavelength of the lasing or an integer multiple thereof), the last-grown cladding layer 36 can be formed from a plurality of sub-layers of different semiconductor alloy compositions and layer thicknesses, with one or more of the sub-layers acting as indicator layers (e.g. to indicate a depth of the etching by laser reflectometry for a dry etching process) or etch-stop layers (e.g. to terminate the etching for a wet etching process). In this first example, the last-grown cladding layer 36 in the mode-control region 14 can have a predetermined layer thickness so that the second effective cavity length, $L_{eff-2}$, is detuned to reduce a combined reflectivity (i.e. a product, $R_1R_2$, of the reflectivity of each stack mirror) thereof to a predetermined value. This can be done, for example, by selecting the predetermined layer thickness of the last-grown cladding layer 36 to be other than an integer multiple of one-half wavelength of the lasing during epitaxial growth thereof.

After patterning of the last-grown cladding layer 36, epitaxial growth can be resumed to form the upper stack mirror 20 as shown in FIG. 1. Such epitaxial regrowth is generally less problematic when the exposed upper surface of the last-grown cladding layer 36 does not include aluminum (which can form an aluminum oxide that can be difficult to remove prior to regrowth). Either MBE or MOCVD can be used for the epitaxial regrowth, with MOCVD generally planarizing the layers of the upper stack mirror 20 more rapidly than for MBE, thereby reducing a lateral offset in the layers.

In the example of FIG. 1, the upper stack mirror 20 is grown as a unipolar structure and is doped oppositely (e.g. p-type doping with C to about $5 \times 10^{17}$ cm$^{-3}$ or more) from the lower stack mirror 18. The doping concentration can be increased to about $10^{19}$ cm$^{-3}$ or more in the last few layers of the upper stack mirror 20 to facilitate electrically contacting the mirror 20 with a deposited upper electrode 26. The upper stack mirror 20 is formed from a plurality of mirror periods, each comprising a high-refractive-index layer 30 and an alternating low-refractive index semiconductor layer 32 similar to those of the lower stack mirror 18. The upper stack mirror 20 has a predetermined number of mirror periods to provide a selected value of the combined reflectivity, $R_1R_2$, for a first optical cavity, $C_1$, of the VCSEL 12, with the exact number of mirror periods for each of the stack mirrors 18 and 20 depending on a predetermined value of the combined reflectivity and also on whether the VCSEL 12 emits lasing action in an upward direction as shown in FIG. 1, or downward through the substrate 16.

After formation of the upper stack mirror 20, electrodes 26 and 28 are formed above and below the semiconductor junction within the light-emitting region to electrically contact the VCSEL device 10. The electrodes 26 and 28 can comprise any metals or metal alloys suitable for forming electrical contacts to the semiconductor alloys forming the substrate 16 and semiconductor layers epitaxially grown thereon. A suitable electrode metallization for n-type semiconductor alloys (e.g. an n-doped substrate 16) is, for example, AuGe/Ni/Au; and suitable electrode metallizations for p-type semiconductor alloys (e.g. a p-doped upper stack mirror 20) are Ti/Pt/Au, AuBe/Ti/Au or the like. One of the electrodes 26 or 28 can be photolithographically patterned to form an opening therein for transmission of the lasing action therethrough, or for independently addressing a plurality of VCSELs 12 in an array VCSEL device 10. Alternately a transparent metallization (e.g. indium-tin oxide) can be used so that the lasing can be transmitted through at least one of the electrodes. Furthermore, to channel an electrical current into the light-emitting region of the VCSEL 12 for more efficient operation thereof, the upper stack mirror 20 in the mode control region 14 in the example of FIG. 1 can be ion implanted (e.g. with hydrogen or oxygen ions) to increase an electrical resistance therein prior to depositing the upper electrode 26, or can include one or more insulating layers therein (e.g. a patterned SiO$_2$ layer deposited above the upper stack mirror 20 in the mode-control region 14 prior to deposition of the upper electrode 20).

In other embodiments of the present invention as described hereinafter, the upper stack mirror 20 can be removed, at least in part, in the mode-control region 14 and replaced by a metal mirror (which can form a part of the upper electrode 26), or by a deposited dielectric stack mirror comprising alternating high-refractive-index and low-refractive-index dielectric layers. This can be advantageous for adjusting the combined reflectivity of a second optical cavity, $C_2$, of the mode-control region 14 to a predetermined value.

Additionally, the step for forming the well 38 in the last-grown cladding layer 36 can be omitted, and instead a dielectric material can be deposited or formed (e.g. by a wet oxidation step whereby an AlGaAs last-grown cladding layer 36 is chemically converted, at least in part, by exposure to moisture at an elevated temperature for sufficient time to form a dielectric layer comprising an oxide of aluminum) as an annular ring above or within the last-grown cladding layer 36 in the mode-control region 14 to provide the mode-control region 14 with a second effective cavity length, $L_{eff\text{-}2}$, different from the first effective cavity length, $L_{eff\text{-}1}$, of the VCSEL 12. A dielectric material above the last-grown cladding layer 36 can increase the second effective cavity length, $L_{eff\text{-}2}$, relative to the first effective cavity length, $L_{eff\text{-}1}$; whereas a dielectric material formed within the last-grown cladding layer 36 can decrease the second effective cavity length, $L_{eff\text{-}2}$, relative to the first effective cavity length, $L_{eff\text{-}1}$, since the formed dielectric material (e.g. an oxide of aluminum) generally has a lower refractive index, n, than the semiconductor alloy from which it is formed while the thickness of the last-grown cladding layer 36 can remain substantially unchanged.

According to the present invention, the VCSEL device 10 in the example of FIG. 1 can be formed either as an index-guided VCSEL device 10 or as an index-antiguided VCSEL device 10 depending on relative values of the first and second effective cavity lengths, $L_{eff}$. The first effective cavity, $L_{eff\text{-}1}$, length determines a cavity mode resonant wavelength, within a first optical cavity, $C_1$, of the VCSEL 12; whereas the second effective cavity length, $L_{eff\text{-}2}$, determines a cavity mode resonant wavelength, $\lambda_2$, within a second optical cavity, $C_2$, of the mode-control region 14, with the wavelengths $\lambda_1$ and $\lambda_2$ being different. In the case of a VCSEL device 10 having a first effective cavity length, $L_{eff\text{-}1}$ of about 2 μm, the second effective cavity length, $L_{eff\text{-}2}$, can be different by about ±30 nanometers to provide a mode-control effect that is equivalent to an effective refractive index change, Δn, of about ±0.05 between the first and second optical cavities.

Figure 2:
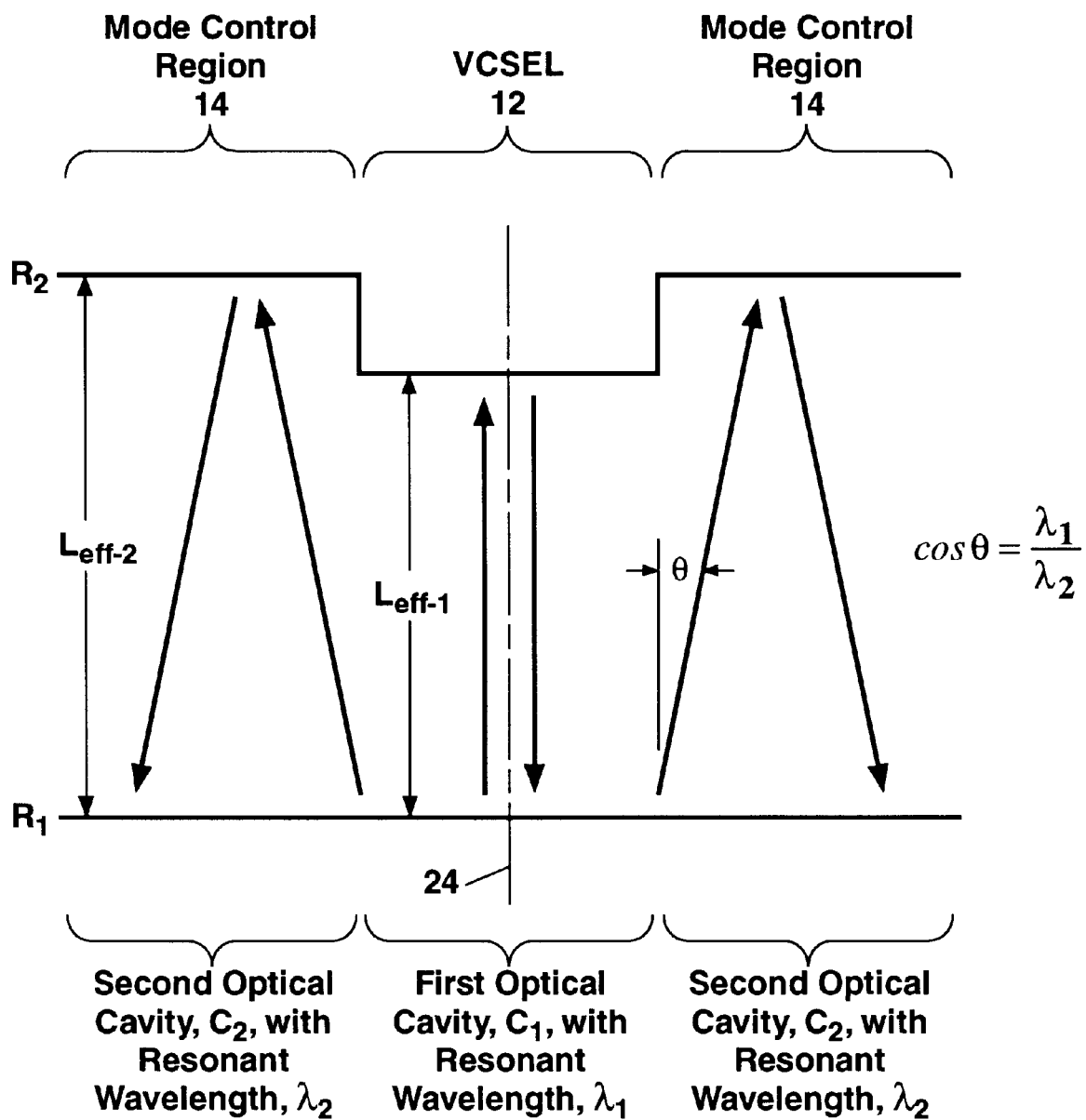
FIG. 2 shows a simplified representation of the first and second optical cavities in the VCSEL device for explaining operation thereof.

FIG. 2 shows a simplified representation of the first and second optical cavities ($C_1$ and $C_2$) of the VCSEL 12 and mode control region 14, respectively, and the propagation of the lasing action within each optical cavity. For simplicity, each of the stack mirrors 18 and 20 with a distributed reflectivity has been replaced by an equivalent mirror having the same reflectivity ($R_1$ or $R_2$), with the equivalent mirrors being spaced apart at the first or second equivalent cavity lengths ($L_{eff\text{-}1}$ and $L_{eff\text{-}2}$, respectively).

In the VCSEL 12, lasing preferably occurs in only a single longitudinal and lateral lasing mode (i.e. a fundamental mode) at or near the resonant wavelength $\lambda_1$ determined by a Fabry-Perot resonance condition of the first optical cavity, $C_1$. Within the VCSEL 12, the lasing mode is generally centered about the optical axis 24, with propagation vectors (indicated by arrows) that are substantially parallel to the optical axis 24. However, some of the lasing mode can be diffracted out of the first optical cavity, $C_1$, of the VCSEL 12 and into the second optical cavity, $C_2$, of the mode control region 14. Since the second optical cavity, $C_2$, has a different effective cavity length (i.e. $L_{eff\text{-}2}$) and therefore a different resonant wavelength, $\lambda_2$, the propagation vectors of the diffracted lasing must tilt at an angle, θ, to the optical axis 24 to maintain the Fabry-Perot resonance condition within the second optical cavity, $C_2$, of the mode control region 14. Any of the lasing coupled into the mode control region 14 that has a propagation vector at an angle substantially different from θ given by:

$$\cos\theta = \lambda_1/\lambda_2$$

will not be resonant in the second optical cavity, $C_2$, and therefore will be damped out. This loss of energy (i.e. the diffracted lasing) from the VCSEL 12 results in an index-antiguiding of the lasing action therein, and enhances a mode selectivity of the VCSEL device 10, with any higher-order transverse modes having a significantly greater radiation loss than the fundamental mode. Advantages of index-antiguided operation of the VCSEL device 10 include an increased mode selectivity, leading to a high lasing output power being emitted into a fundamental near-diffraction-limited beam 40, a decreased sensitivity for operation over a wide temperature range (i.e. a reduced thermal lensing), and improved high-speed modulation characteristics due to a high degree of stability of the lasing mode.

The tilt angle, θ, given by the above equation produces a result similar to a total internal reflection of the diffracted lasing within the mode control region 14 such as can occur were the first and second optical cavities to have equal as-grown or actual lengths (e.g. if the well 38 were to be omitted) but different indices of refraction, n, with the mode-control region 14 having a refractive index larger than that of the VCSEL 12 by an amount, Δn, given by:

$$\frac{\Delta n}{n} = \frac{(\lambda_2 - \lambda_1)}{\lambda_1} = \frac{\Delta\lambda}{\lambda_1}.$$

Thus, an effective index difference, Δn, according to the teaching of the present invention can be generated by detuning the resonant wavelengths of the VCSEL 12 and the mode control region 14 by an amount a $\Delta\lambda = (\lambda_2 - \lambda_1)$. Such wavelength detuning, Δλ, can further be provided according to the teaching of the present invention by providing a cavity length difference, ΔL, between the first effective cavity length, $L_{eff\text{-}1}$, of the VCSEL 12 and the second effective cavity length, $L_{eff\text{-}2}$, of the mode-control region 14 as shown in the example of FIG. 1. This is possible due to the relationship:

$$\frac{\Delta\lambda}{\lambda_1} = \frac{\Delta L}{L_{eff-1}} = \frac{L_{eff-2} - L_{eff-1}}{L_{eff-1}}$$

between the wavelength detuning, Δλ, and the cavity length difference, ΔL. The effective index change, Δn, in the mode control region 14 can be either positive (producing index antiguiding within the VCSEL 12) or negative (producing index guiding within the VCSEL 12) depending on the sign and size of the wavelength detuning, Δλ. This is shown in the results of a series of calculations presented in FIG. 3.

Figure 3:
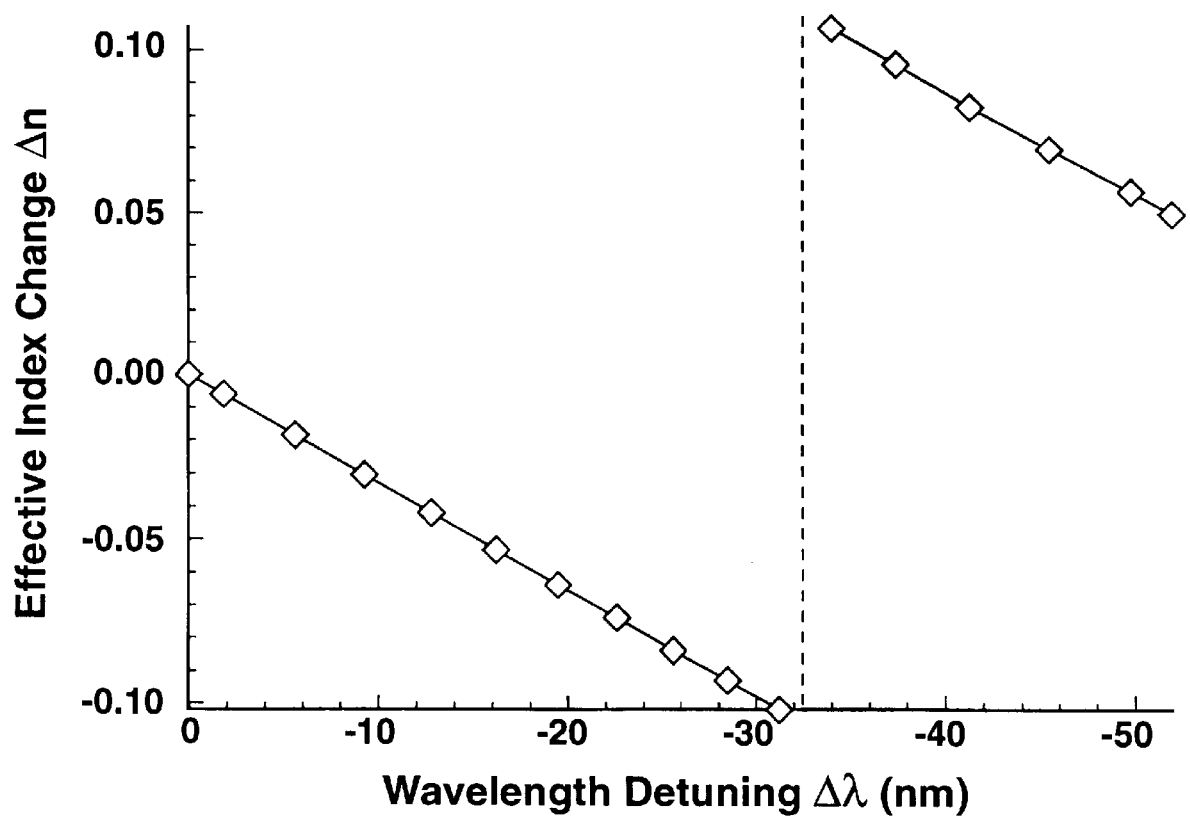
FIG. 3 shows a series of calculated points and a straight-line fit to show an effective index change, $\Delta n$, that can be produced by a wavelength shift, $\Delta\lambda$, between the resonant wavelengths $\lambda_1$ and $\lambda_2$ of FIG. 2 for wavelengths near 975 nanometers.

FIG. 3 shows a series of calculated points and a straight-line fit for an effective index change or step, Δn, that can be produced by a wavelength shift, Δλ, between the resonant wavelengths $\lambda_1$ and $\lambda_2$ near 975 nanometers. These calculations were performed for a blue-shifting (i.e. a downward shift in wavelength) of the resonant wavelength, $\lambda_2$, within the mode control region 14 relative to the resonant wavelength, $\lambda_1$, within the VCSEL 12 (i.e. Δλ<0). As shown in FIG. 3, a small shift in the resonant wavelength detuning, Δλ, up to about 30 nanometers produces a negative effective index change, Δn, of up to about −0.10 resulting in index guiding of the lasing action. However, as the detuning, Δλ, is further increased, the effective index change, Δn, abruptly shifts to being positive at a crossover point indicated by the vertical dashed line; and the lasing action becomes antiguided. This abrupt transition from index guiding to index antiguiding occurs when a first lasing mode is shifted far enough in wavelength so that the first lasing mode moves outside a stop band of the stack mirrors 18 and 20 and encounters a large optical loss due to an increased transmission of the mirrors. At this point, a second lasing mode (i.e. an adjacent longitudinal cavity mode) becomes dominant by being shifted to within the stop band of the stack mirrors where the reflectivity is high and the optical loss is substantially reduced. Lasing of the second mode then produces a positive effective index change, Δn, as shown in FIG. 3, with the positive effective index change being reduced with further wavelength detuning. Such a positive effective index change can also be produced if the original lasing mode were to be red-shifted (i.e. shifted upward in wavelength to provide a wavelength detuning Δλ>0).

EXAMPLE 2

Figure 4:
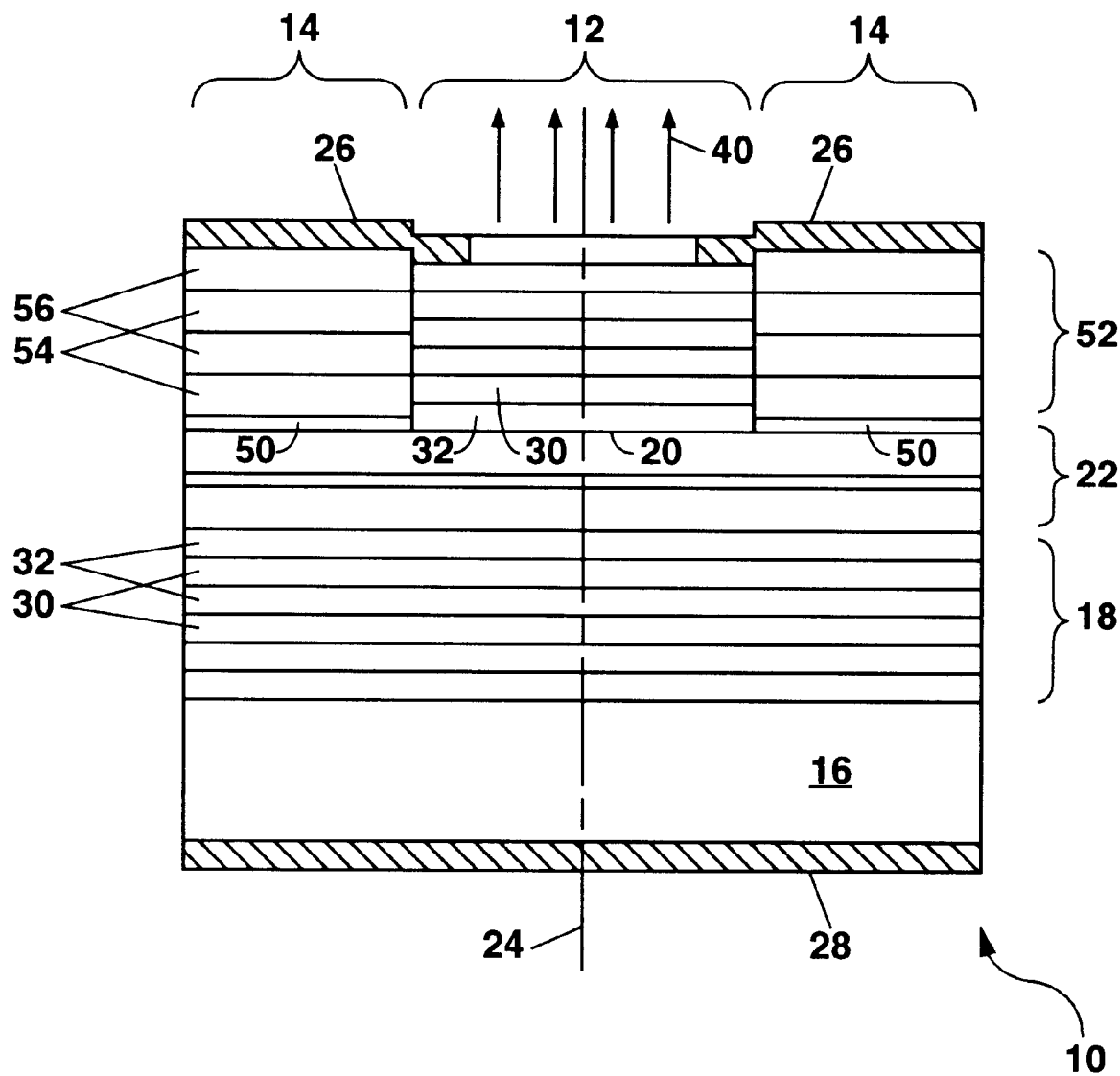
FIG. 4 shows a schematic cross-section diagram of a second example of a VCSEL device of the present invention formed by selective etching and deposition of a dielectric stack mirror above a spacer layer.

FIG. 4 shows a schematic cross-section diagram of a second example of a VCSEL device 10 according to the present invention. The second example of the present invention can be formed by initially growing a plurality of compound semiconductor layers on a substrate 16 forming a lower stack mirror 18, an active region 22 and an upper stack mirror 20, with each stack mirror comprising alternating high-refractive-index and low-refractive-index semiconductor layers 30 and 32, respectively. The semiconductor alloy compositions, layer thicknesses, and doping levels can be similar to those of the first example of the present invention, and in general will depend upon a predetermined wavelength range for operation of the VCSEL device 10.

After completion of the epitaxial growth process by MBE, MOCVD or the like, photolithographic masking and etching steps can be used to partially or entirely remove the second stack mirror 20 in the mode-control region 14. A spacer layer 50 is then deposited (e.g. deposited $SiO_2$) or formed (e.g. by a wet oxidation process whereby a portion of an AlGaAs low-refractive-index semiconductor layer 32 proximate to the active region 22 is chemically converted to form an oxide of aluminum by exposure to moisture an elevated temperature of about 350°–500° C. for a predetermined period of time) above the active region 22 with a predetermined layer thickness. In this second example, the mode-coupling portion of the mode-control region 14 comprises the layered active region 22 and the spacer layer 50 as shown in FIG. 4. In other embodiments of the present invention, the spacer layer 50 can be located within the active region (e.g. by oxidizing at least a part of an AlGaAs upper cladding layer 36, or by oxidizing an AlGaAs sub-layer within the upper cladding layer 36).

After the spacer layer 50 is deposited or formed, a dielectric stack mirror 52 can be deposited (e.g. by electron-beam evaporation or sputtering) in the form of a plurality of alternating low-refractive-index dielectric layers 54 and high-refractive-index dielectric layers 56, with each pair of dielectric layers 54 and 56 forming a mirror period of the dielectric stack mirror 52. An advantage of a VCSEL device 10 formed according to this second example of the present invention is that a combined reflectivity of a second pair of mirrors (i.e. the mirrors 18 and 52) in the mode-control region 14 can be different from the combined reflectivity of a first pair of mirrors (i.e. the mirrors 18 and 20) in the VCSEL 12. This is especially useful to reduce the combined reflectivity, $R_1 R_2$, of the second pair of mirrors to control a mode coupling between adjacent VCSELs in an array VCSEL device 10, or to lower any optical gain produced within the mode-control region 14 due to a current injection therein (e.g. due to a lateral current spreading in the active region 22 or the lower stack mirror 18). The use of the dielectric stack mirror 52 and the spacer layer 50 further aid in efficiently channeling the current into the light-active region of the VCSEL 12, thereby increasing a lasing output power from the VCSEL device 10 and reducing a threshold for lasing therein.

EXAMPLE 3

Figure 5:
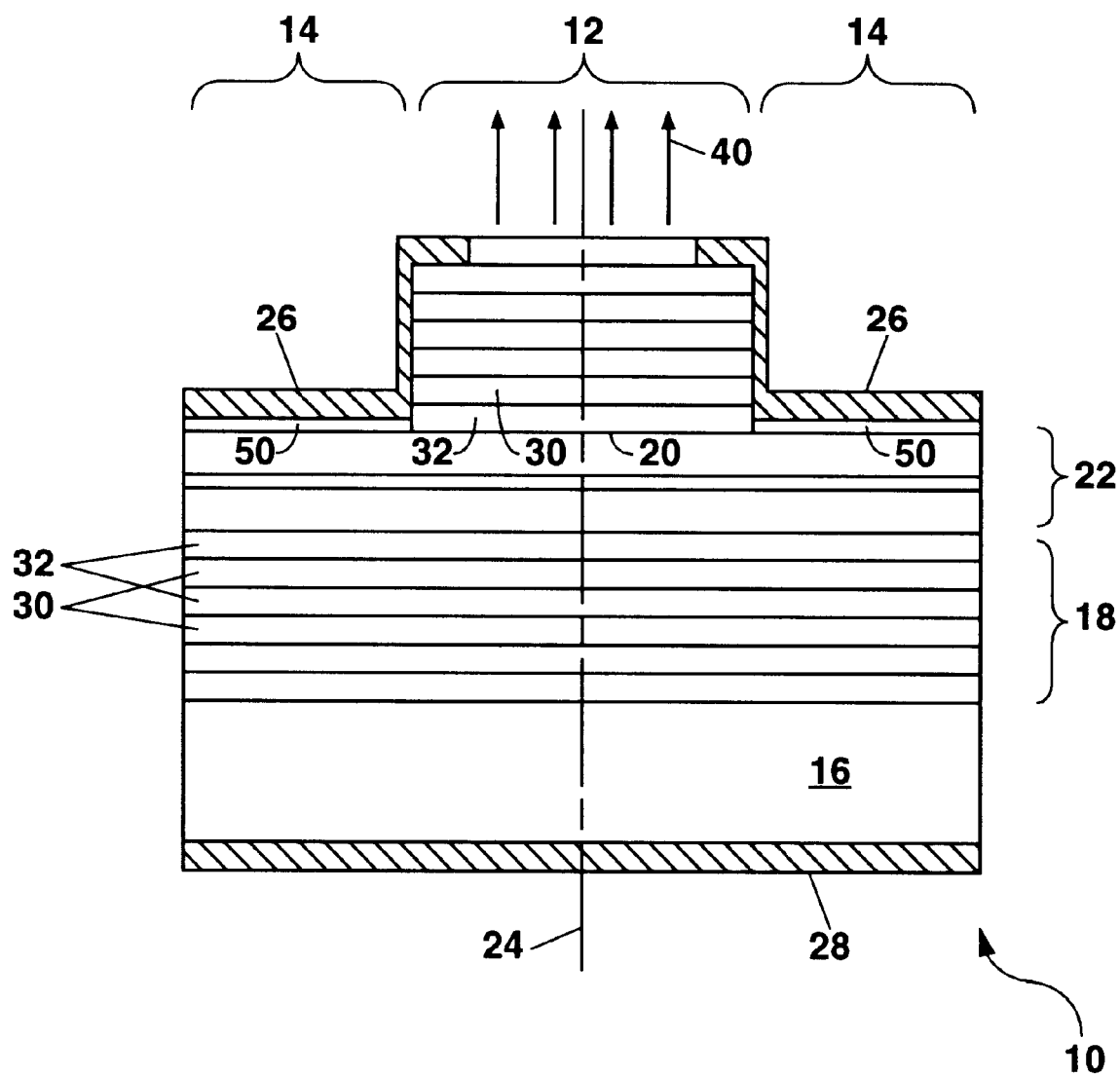
FIG. 5 shows a schematic cross-section diagram of a third example of a VCSEL device of the present invention formed by substitution of a metal mirror for the dielectric stack mirror of FIG. 4.

FIG. 5 shows a schematic cross-section diagram of a third example of the VCSEL device 10 according to the present invention. The third example of the present invention can be formed similarly to the second example in FIG. 4, but with a metal mirror being substituted for the dielectric stack mirror 52. As shown in FIG. 5, the metal mirror can be formed by deposition of the upper electrode 26, especially when the upper electrode 26 is not annealed. In this third example of the present invention, the second pair of mirrors forming the second optical cavity, $C_2$, is formed from the lower stack mirror 18 and a portion of the upper electrode 26 overlying the spacer layer 50. An advantage of this third example of the invention is that fewer fabrication steps are required by substituting the metal mirror for the dielectric stack mirror 52. Additionally, the combined reflectance of the second pair of mirrors in the mode-control region 14 can be reduced slightly by the use of a metal mirror as shown in FIG. 5.

EXAMPLE 4

Figure 6:
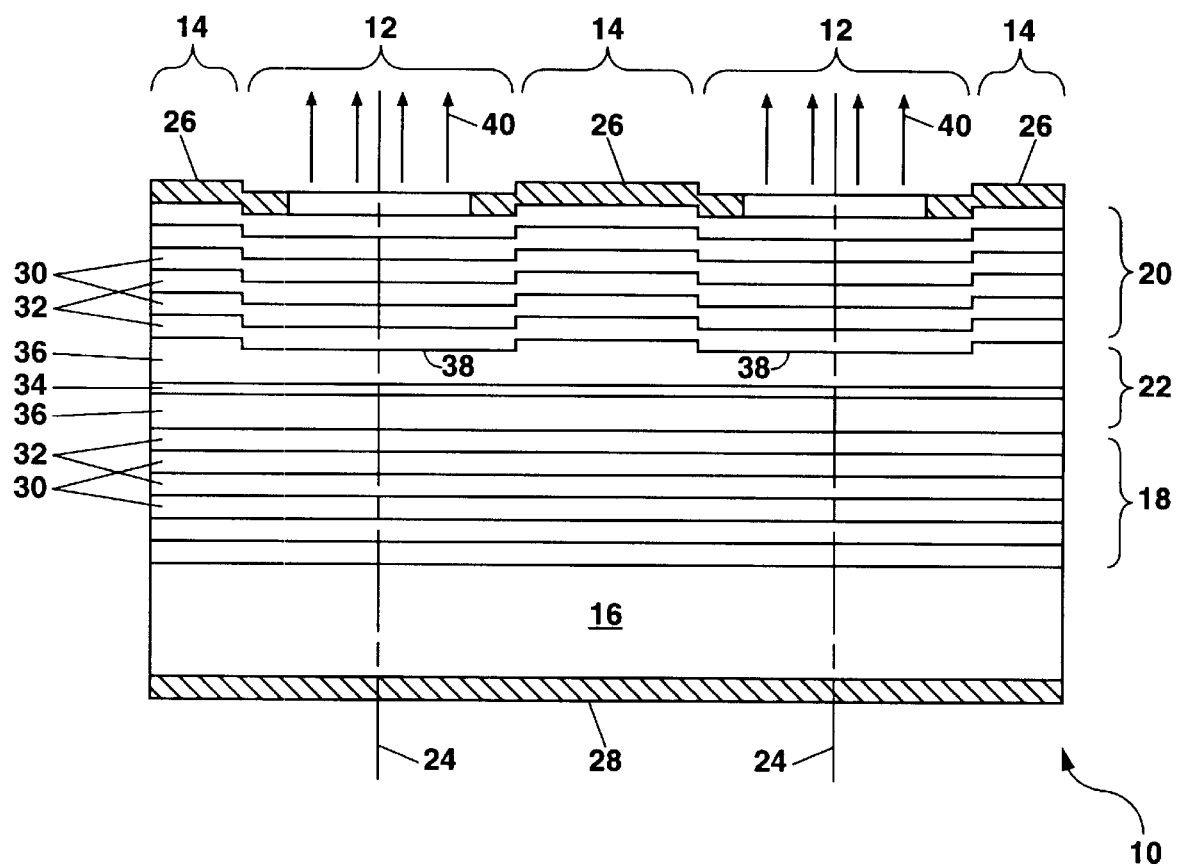
FIG. 6 shows a schematic cross-section diagram of a fourth example of a VCSEL device of the present invention in the form of an array of spaced VCSELs, with each VCSEL having a structure similar to that of FIG. 1.

FIG. 6 shows a schematic cross-section diagram of a fourth example of the VCSEL device 10 of the present invention in the form of a plurality of spaced VCSELs 12. Each VCSEL 12 and a surrounding mode-control region 14 can be formed as described heretofore with reference to the first example of the present invention. The mode-control region 14 surrounding each VCSEL 12 to control the lasing action therein can also be used to provide an optical coupling of the lasing action between one or more adjacent VCSELs 12 forming a one-or two-dimension array VCSEL device 10 so that the VCSELs 12 forming the array device 10 having a plurality of lasing output beams 40 that are substantially in-phase so that the output beams 40 are additive to produce a single-lobed far-field beam. A two-dimensional array VCSEL device 10 can be formed, for example, as a rectangular array of VCSELs 12 each generally of a uniform size and spacing, or as a concentric array of VCSELs 12 (e.g. formed from a plurality of annular-shaped VCSELs 12 of different sizes arranged as rings about a central circular or square VCSEL 12 with a lateral coupling of the lasing action radially between adjacent VCSELs 12).

Figure 10:
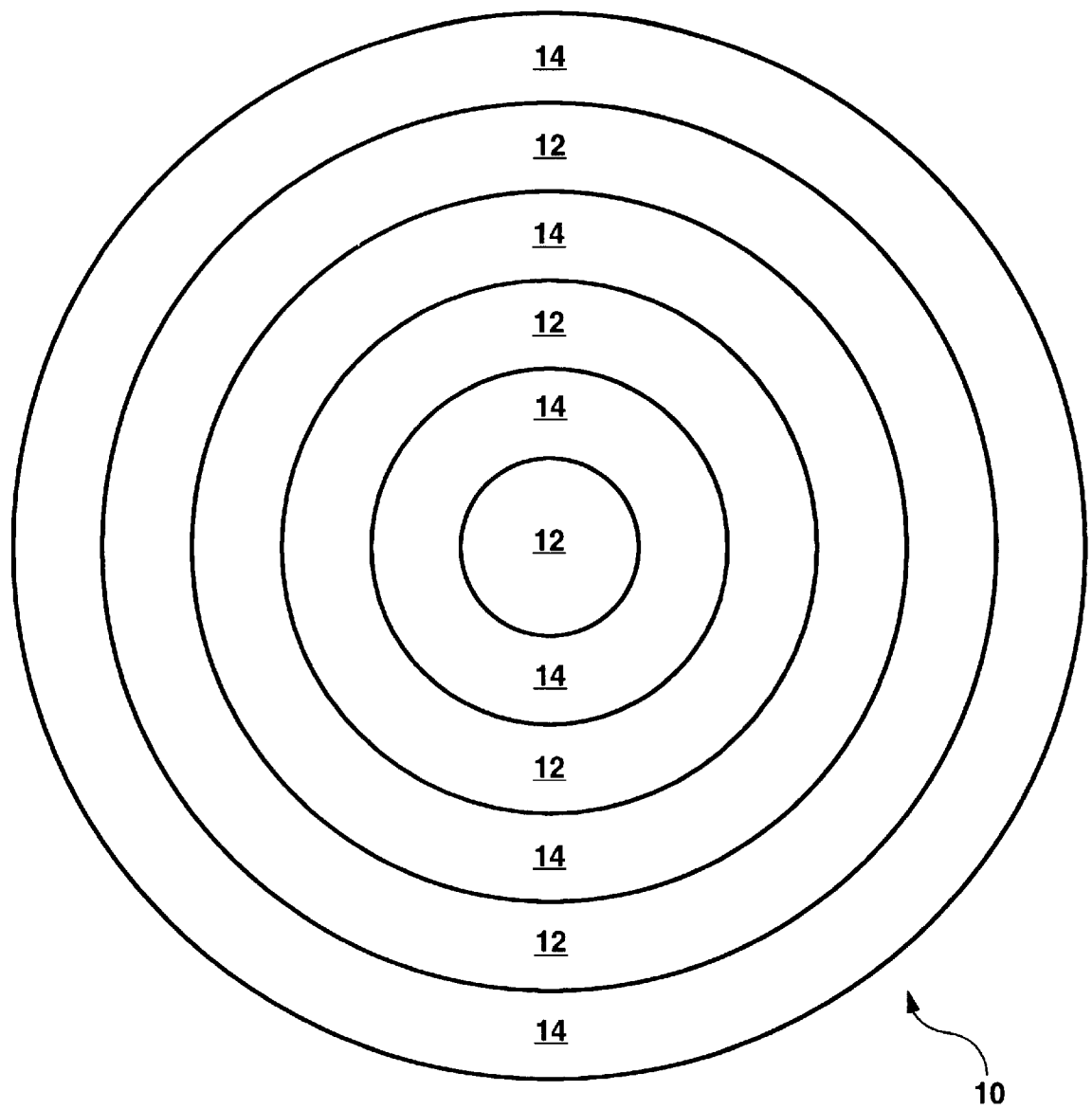
FIG. 10 shows a plan view of a concentric array of VCSELs formed from a plurality of annular shaped VCSELs of different sizes arranged as rings about a central circular VCSEL, with a lateral coupling of the lasing action radially between adjacent VCSELs.

FIG. 10 shows an array of annular-shaped VCSELs 12 arranged as concentric rings separated by annular-shaped mode-control regions 14 according to the present invention.

For efficient and useful operation of an array VCSEL device 10, an important consideration is that the lasing emission from each VCSEL 12 in the array be additive so that a single-lobed far-field beam is produced which is near-diffraction-limited. Such additive lasing emission increases a lasing output power from the VCSEL device 10, but generally requires that all the VCSELs 12 be optically coupled together to produce lasing emission that is substantially in-phase. This optical coupling can be provided by the mode-control regions 14 in the VCSEL device 10 in the example of FIG. 6. For in-phase lasing, index-antiguided operation (also termed leaky-mode coupling) of adjacent VCSELs 12 is preferred since the adjacent VCSELs 12 can be directly coupled by the tilted propagation vectors successively reflecting off the second pair of mirrors in the mode-control region 14 as shown in FIG. 2. In this way, the diffracted lasing can be coupled to one or more adjacent VCSELs 12 where it is recaptured, thereby reducing the energy loss within the VCSEL device 10. A lateral dimension of the mode-control region 14 in the fourth example of the present invention in FIG. 6, can be predetermined for optimizing the optical coupling between adjacent VCSELs 12 for in-phase lasing emission.

EXAMPLE 5

Figure 7:
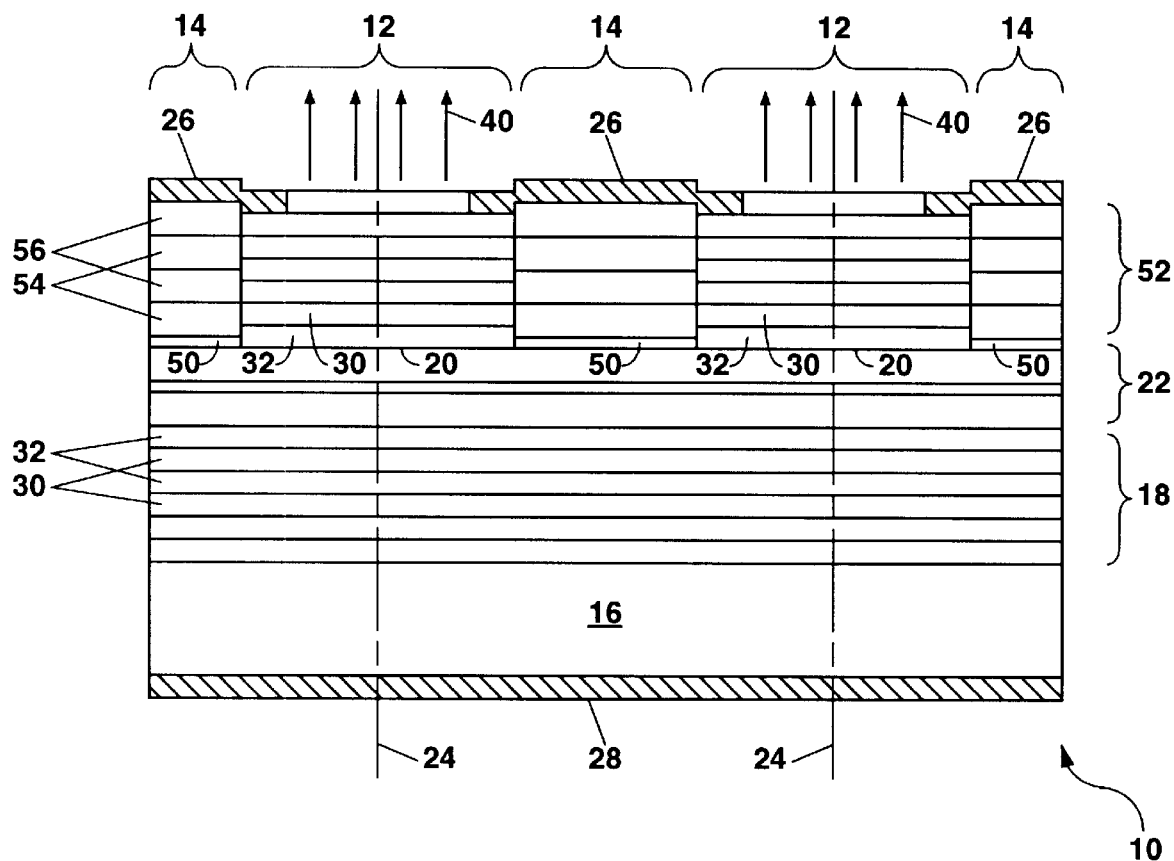
FIG. 7 shows a schematic cross-section diagram of a fifth example of a VCSEL device of the present invention in the form of an array of VCSELs, with each VCSEL having a structure similar to that of FIG. 2.

FIG. 7 shows a schematic cross-section diagram of a fifth example of the present invention in the form of a one- or two-dimensional array VCSEL device 10. Each VCSEL 12 in this example of the invention can be formed as described heretofore with reference to the second example of FIG. 4. An optical coupling (e.g. an index-antiguided coupling) can be provided between one or more pairs of adjacent VCSELs 12 by the mode-control regions 14 which also act to control the lasing mode within each VCSEL 12.

Figure 8:
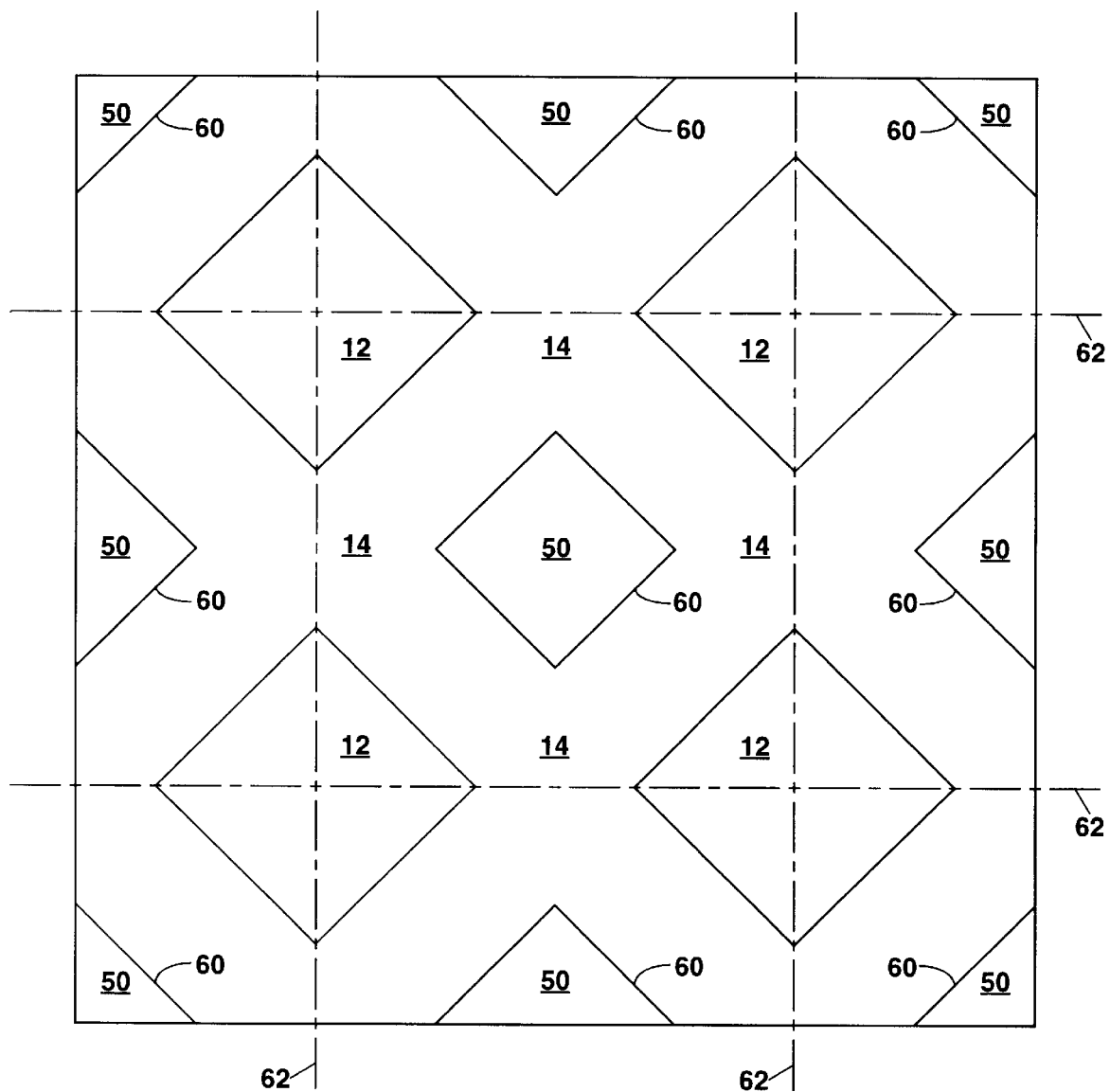
FIG. 8 shows a plan view of a portion of an array VCSEL device formed according to the present invention with the individual VCSELs being defined by a buried spacer layer formed by a lateral oxidation process after etching a plurality of shaped openings.

In FIG. 7 the array VCSEL device 10 is shown with a dielectric stack mirror formed from alternating high-refractive-index and low-refractive-index dielectric layers 54 and 56. However, in other embodiments of the present invention, the array device 10 can also be formed with a common semiconductor upper stack mirror 20 for both the VCSELs 12 and the mode-coupling regions 14. This can be done, for example, by etching a plurality of shaped openings 60 down at least partway through the semiconductor layers forming the upper stack mirror 20 as shown in FIG. 8. The shaped openings 60 can be formed, for example, at locations away from an optical coupling axis 62 between one or more pairs of nearest-neighbor VCSELs 12 as shown in FIG. 8. At these locations, the optical coupling is weak and can be perturbed without substantially affecting a phase locking between each pair of nearest-neighbor VCSELs 12.

A spacer layer 50 can then be formed from one of the semiconductor layers (e.g. an AlGaAs first-grown low-refractive-index layer 32 of the semiconductor upper stack mirror 20 or an AlGaAs sub-layer of the last-grown cladding layer 36) by the wet oxidation process described heretofore. If a semiconductor layer from which the spacer layer 50 is formed by the wet oxidation process has an aluminum content higher than the aluminum content of the upper cladding layer 36 (and preferably higher than the remaining low-refractive-index layers 32 of the upper stack mirror 20) then the wet oxidation process can proceed laterally underneath the upper stack mirror 20 for a predetermined period of time to form a buried portion of the spacer layer 50 between the shaped openings 60 and the VCSELs 12, with the spacer layer forming a current blocking region that effectively defines the lateral dimensions of each VCSEL 12. (The square-shaped VCSELs 12 in FIG. 8 have a fundamental mode for lasing which is circular with a gaussian intensity profile.) This formation of a buried portion of the spacer layer 50 is possible due to a nonlinear increase in a rate of oxidation of $Al_xGa_{1-x}As$ with increasing aluminum composition, x, which is especially pronounced when the aluminum composition is in the range of about $0.8 \leq x \leq 1$ (see, for example, U.S. Pat. No. 5,493,577 to Choquette et al which is incorporated herein by reference for further details of the wet oxidation process). After formation of the spacer layer 50, the shaped openings 60 can be filled in with a polyimide or the like for planarization prior to depositing the upper electrode 26.

EXAMPLE 6

Figure 9:
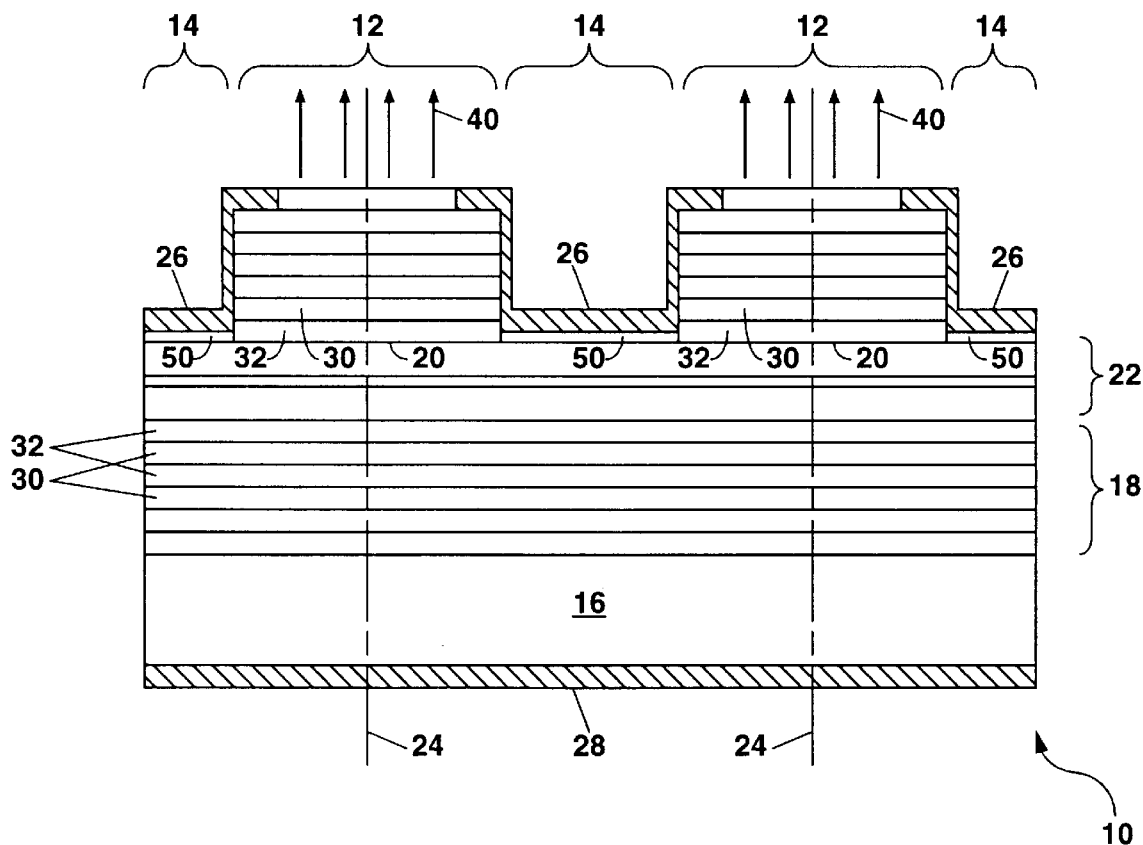
FIG. 9 shows a schematic cross-section diagram of a sixth example of a VCSEL device of the present invention in the form of an array of VCSELs, with each VCSEL having a structure similar to that of FIG. 3.

FIG. 9 shows a schematic cross-section diagram of a sixth example of the present invention in the form of a one- or two-dimensional array VCSEL device 10. Each VCSEL 12 in this example of the invention can be formed as described heretofore with reference to the third example of FIG. 5. A metal mirror is provided in the mode-control region 14 with the metal mirror being preferably formed by deposition of a metallization forming the upper electrode 26. The spacer layer 50 in the example of FIG. 9 can be either an unetched semiconductor layer (e.g. a part of a first-grown low-refractive-index semiconductor layer 32 such as an AlGaAs semiconductor layer), or a deposited dielectric layer (e.g. $SiO_2$ or the like), or a formed dielectric layer (e.g. by oxidation of an unetched semiconductor layer or sub-layer comprising AlGaAs). In any case, it is desirable that a current flow through the spacer layer 50 be reduced or eliminated so that the current flow is channeled primarily into the light-emitting region of each VCSEL 12.

The matter set forth in the foregoing description and accompanying drawings is offered by way of illustration only and not as a limitation. Other applications and variations of the vertical-cavity surface-emitting device will become evident to those skilled in the art. The actual scope of the invention is intended to be defined in the following claims when viewed in their proper perspective based on the prior art.

What is claimed is:

1. A vertical-cavity surface-emitting laser device comprising:
   at least one vertical-cavity surface-emitting laser having a layered semiconductor light-emitting region of predetermined lateral dimensions and including a semiconductor junction; a first pair of mirrors sandwiched about the light-emitting region forming a first optical cavity with a first effective cavity length; and electrodes above and below the semiconductor junction for activating the light-emitting region to produce lasing action; and
   a mode-control region formed laterally about and in contact with each light-emitting region and further comprising a second pair of mirrors sandwiched about a mode-coupling portion forming a second optical cavity with a second effective cavity length different from the first effective cavity length, and with the electrodes extending above and below the mode-control region.

2. The device of claim 1 wherein the mode-coupling portion has a layer thickness different from the layer thickness of the semiconductor light-emitting region.

3. The device of claim 1 wherein the mode-coupling portion includes at least one layer having a refractive index different from the refractive index of the layered semiconductor light-emitting region.

4. A vertical-cavity surface-emitting laser device comprising:
   at least one vertical-cavity surface-emitting laser having a layered semiconductor light-emitting region of predetermined lateral dimensions and including a semiconductor junction: a first pair of mirrors sandwiched about the light-emitting region forming a first optical cavity with a first effective cavity length: and electrodes above and below the semiconductor junction for activating the light-emitting region to produce lasing action: and a mode-control region formed laterally about the light-emitting region and further comprising a second pair of mirrors sandwiched about a mode-coupling portion forming a second optical cavity with a second effective cavity length different from the first effective cavity length wherein a layer thickness or a refractive index of the mode-coupling portion provides a difference between the first and second effective cavity lengths sufficient for the lasing action to be antiguided.

5. The device of claim 1 wherein the mode-coupling portion provides for a coupling of the lasing action between a plurality of adjacent vertical-cavity surface-emitting lasers.

6. The device of claim 5 wherein the lasing action in the plurality of vertical-cavity surface-emitting lasers is substantially in-phase.

7. A vertical-cavity surface-emitting laser device comprising:

at least one vertical-cavity surface-emitting laser having a layered semiconductor light-emitting region of predetermined lateral dimensions and including a semiconductor junction; a first pair of mirrors sandwiched about the light-emitting region forming a first optical cavity with a first effective cavity length; and electrodes above and below the semiconductor junction for activating the light-emitting region to produce lasing action: and a mode-control region formed laterally about the light-emitting region and further comprising a second pair of mirrors sandwiched about a mode-coupling portion forming a second optical cavity with a second effective cavity length different from the first effective cavity length wherein the mode-coupling portion provides for a coupling of the lasing action between a plurality of adjacent vertical-cavity surface-emitting lasers to form an antiguided array of vertical-cavity surface-emitting lasers.

8. The device of claim 5 wherein the plurality of vertical-cavity surface-emitting lasers are arranged to form a rectangular array.

9. The device of claim 5 wherein the plurality of vertical-cavity surface-emitting lasers are arranged to form a concentric array.

10. The device of claim 1 wherein the mode-coupling portion comprises at least in part a dielectric material.

11. The device of claim wherein the dielectric material comprises an oxide of aluminum.

12. The device of claim 1 wherein each mirror of the first and second pair of mirrors is a semiconductor stack mirror.

13. The device of claim 1 wherein at least one mirror of the second pair of mirrors is a dielectric stack mirror formed of alternating high-refractive-index and low-refractive-index dielectric layers.

14. The device of claim 1 wherein at least one mirror of the second pair of mirrors is a metal mirror.

15. The device of claim 14 wherein the metal mirror forms a part of one of the electrodes.

16. The device of claim 1 wherein the second pair of mirrors has a combined reflectivity that is different from the combined reflectivity of the first pair of mirrors.

17. A vertical-cavity surface-emitting laser device comprising:

a plurality of vertical-cavity surface-emitting lasers each having a first effective cavity length; and a mode-control region separating the plurality of spaced vertical-cavity surface-emitting lasers, the mode-control region being characterized by a second effective cavity length different from the first effective cavity length, and electrodes above and below the mode control region to provide for a reduced flow of an electrical current as compared with the current flow in the plurality of vertical-cavity surface-emitting lasers.

18. The device of claim 17 wherein each vertical-cavity surface-emitting laser comprises:

a layered semiconductor light-emitting region having a semiconductor junction therein;

a first pair of mirrors formed about the light-emitting region for defining a first optical cavity having the first effective cavity length; and electrodes above and below the semiconductor junction for activating the light-emitting region to produce lasing action.

19. The device of claim 18 wherein the mode-control region comprises a mode-coupling portion having, at least in part, a refractive index different from the refractive index of the semiconductor light-emitting region.

20. A vertical-cavity surface-emitting laser device comprising:

a plurality of vertical-cavity surface-emitting lasers each having a first effective cavity length, and further comprising a layered semiconductor light-emitting region having a semiconductor junction therein, a first pair of mirrors formed about the light-emitting region to define a first optical cavity with the first effective cavity length, and electrodes above and below the semiconductor junction for activating the light-emitting region to produce lasing action; and a mode-control region separating the plurality of spaced vertical-cavity surface-emitting lasers and having a second effective cavity length different from the first effective cavity length, the mode-control region further comprising a mode-coupling portion having an effective refractive index sufficient to form a refractive index antiguide for coupling of the lasing action between adjacent vertical-cavity surface-emitting lasers and thereby forming an index-antiguided array of vertical-cavity surface-emitting lasers.

21. The device of claim 19 wherein the mode-coupling portion comprises, at least in part, a dielectric material.

22. The device of claim 21 wherein the dielectric material comprises an oxide of aluminum.

23. The device of claim 19 wherein the mode-coupling portion is sandwiched between a second pair of mirrors defining in combination with the mode-coupling portion the second effective cavity length.

24. The device of claim 23 wherein at least one of the second pair of mirrors is a dielectric stack mirror formed of alternating high-refractive-index and low-refractive-index dielectric layers.

25. The device of claim 23 wherein at least one of the second pair of mirrors is a metal mirror.

26. The device of claim 25 wherein the metal mirror forms a part of one of the electrodes.

27. The device of claim 26 wherein the second pair of mirrors has a combined reflectivity that is different from the combined reflectivity of the first pair of mirrors.

28. The device of claim 17 wherein lasing emitted from each one of the plurality of vertical-cavity surface-emitting lasers is substantially in-phase with the lasing emitted from the remaining vertical-cavity surface-emitting lasers.

29. The device of claim 18 wherein the mode-control region comprises a mode-coupling portion having a layer thickness different from the layer thickness of the semiconductor light-emitting region.

30. A vertical-cavity surface-emitting laser device comprising:
   a plurality of vertical-cavity surface-emitting lasers each having a first effective cavity length and further comprising a layered semiconductor light-emitting region having a semiconductor junction therein, a first pair of mirrors formed about the light-emitting region for defining a first optical cavity having the first effective cavity length; and electrodes above and below the semiconductor junction for activating the light-emitting region to produce lasing action: and
   a mode-control region separating the plurality of spaced vertical-cavity surface-emitting lasers and having a second effective cavity length different from the first effective cavity length, the mode-control region further comprising a mode-coupling portion having a layer thickness different from the layer thickness of the semiconductor light-emitting region for providing a difference between the first and second effective cavity lengths sufficient to form a refractive index antiguide for coupling of the lasing action between adjacent vertical-cavity surface-emitting lasers and thereby forming an antiguided array of vertical-cavity surface-emitting lasers.

31. The device of claim 30 wherein the mode-coupling portion comprises at least in part a dielectric material.

32. A vertical-cavity surface-emitting laser device comprising:
   at least one vertical-cavity surface-emitting laser having a pair of mirrors sandwiched about a semiconductor light-emitting region for defining therein a first effective cavity length;
   cavity means formed laterally about and in contact with each vertical-cavity surface-emitting laser for providing a second effective cavity length optically coupled to the first effective cavity length, with the first and second effective cavity lengths being different; and
   electrodes above and below each vertical-cavity surface-emitting laser and the cavity means for activating the light-emitting region to produce lasing action.

33. A vertical-cavity surface-emitting laser device comprising:
   at least one vertical-cavity surface-emitting laser having a pair of mirrors sandwiched about a semiconductor light-emitting region for defining therein a first effective cavity length; and
   cavity means formed laterally about each vertical-cavity surface-emitting laser for providing a second effective cavity length optically coupled to the first effective cavity length, with the first and second effective cavity lengths being sufficiently different to produce an index-antiguided lasing action within each vertical-cavity surface-emitting laser.

34. The vertical-cavity surface-emitting laser device of claim 32 in the form of an array with each vertical-cavity surface-emitting laser being spaced apart from each other vertical-cavity surface-emitting laser by a predetermined spacing, and with the cavity means providing an optical coupling between adjacent vertical-cavity surface-emitting lasers.

35. A vertical-cavity surface-emitting laser device comprising:
   a plurality of vertical-cavity surface-emitting lasers in the form of an array, with each laser having a first effective cavity length defined by a pair of mirrors sandwiched about a semiconductor light-emitting region and being spaced apart from adjacent lasers in the array; and
   cavity means formed laterally about each laser for providing an index-antiguided optical coupling between adjacent of the lasers, with the cavity means having a second effective cavity length optically coupled to the first effective cavity length, with the first and second effective cavity lengths being different.

36. A vertical-cavity surface-emitting laser device comprising:
   at least one vertical-cavity surface-emitting laser having a layered semiconductor light-emitting region of predetermined lateral dimensions and including a semiconductor junction; a first pair of mirrors sandwiched about the light-emitting region forming a first optical cavity with a first effective cavity length; and electrodes above and below the semiconductor junction for activating the light-emitting region to produce lasing action; and
   a mode-control region formed laterally about and in contact with each light-emitting region and further comprising a mode-coupling portion having a effective optical thickness different from the effective optical thickness of the light-emitting region, and a second pair of mirrors sandwiched about the mode-coupling portion to form a second optical cavity with a second effective cavity length different from the first effective cavity length, with the electrodes extending above and below the mode-control region.

37. The device of claim 36 wherein an actual layer thickness of the mode-coupling portion is different from the actual layer thickness of the light-emitting region.

38. The device of claim 36 wherein the mode-coupling portion includes at least one layer having a refractive index different from the refractive index of the layered semiconductor light emitting region.

39. The device of claim 36 wherein the mode-coupling portion provides for a coupling of the lasing action between a plurality of adjacent vertical-cavity surface-emitting lasers.

40. The device of claim 39 wherein the lasing action from each of the plurality of vertical-cavity surface-emitting lasers is in-phase.

41. The device of claim 36 wherein the mode-coupling portion comprises, at least in part, a dielectric material.

42. The device of claim 41 wherein the dielectric material comprises an oxide of aluminum.

* * * * *